(12) United States Patent
Deng et al.

(10) Patent No.: US 10,861,819 B1
(45) Date of Patent: Dec. 8, 2020

(54) HIGH-PRECISION BOND HEAD POSITIONING METHOD AND APPARATUS

(71) Applicant: ASM Technology Singapore Pte Ltd, Singapore (SG)

(72) Inventors: Jiangwen Deng, Hong Kong (HK); Chung Sheung Yung, Hong Kong (HK); Wui Fung Sze, Hong Kong (HK)

(73) Assignee: ASM TECHNOLOGY SINGAPORE PTE LTD, Singapore (SG)

( * ) Notice: Subject to any disclaimer, the term of this patent is extended or adjusted under 35 U.S.C. 154(b) by 0 days.

(21) Appl. No.: 16/503,678

(22) Filed: Jul. 5, 2019

(51) Int. Cl.
 *H05K 13/08* (2006.01)
 *H01L 23/00* (2006.01)
 *H01L 21/66* (2006.01)

(52) U.S. Cl.
 CPC .............. *H01L 24/75* (2013.01); *H01L 22/20* (2013.01); *H01L 24/83* (2013.01); *H05K 13/089* (2018.08); *H05K 13/0813* (2018.08); *H05K 13/0815* (2018.08); *H01L 2224/75705* (2013.01); *H01L 2224/75753* (2013.01); *H01L 2224/83132* (2013.01)

(58) Field of Classification Search
 CPC ..................... H01L 24/75; H01L 22/20; H01L 2224/75753; H01L 2224/75705; H01L 2224/83132; H05K 13/0015; H05K 13/0813; H05K 13/0815; H05K 13/089
 See application file for complete search history.

(56) References Cited

U.S. PATENT DOCUMENTS

| 7,597,234 B2 | 10/2009 | Blessing et al. ............... 228/105 |
| 2010/0132187 A1* | 6/2010 | Nishino .................. H01L 31/18 29/739 |

* cited by examiner

*Primary Examiner* — Selim U Ahmed
*Assistant Examiner* — Evan G Clinton
(74) *Attorney, Agent, or Firm* — Ostrolenk Faber LLP

(57) ABSTRACT

After a die is picked up with a bond head, a first optical system views and determines a position and orientation of the die relative to the bond head. Separately, a second optical system views and determines a position and orientation of the bonding location when the second optical system has its focal plane configured at a first distance from the second optical system. After the bond head is moved adjacent to the second optical system, the second optical system views and determines a position and orientation of the bond head when the second optical system has its focal plane configured at a second distance from the second optical system. The position and orientation of the die may then be adjusted to correct a relative offset between the die and the bonding location prior to depositing the die onto the bonding location.

19 Claims, 9 Drawing Sheets

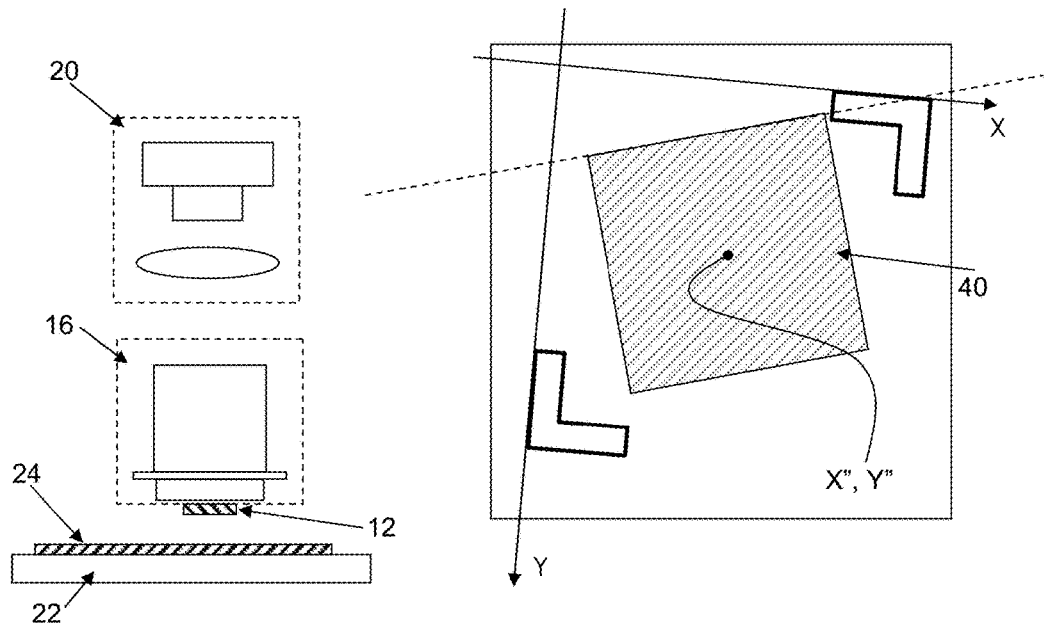
FIG. 3D
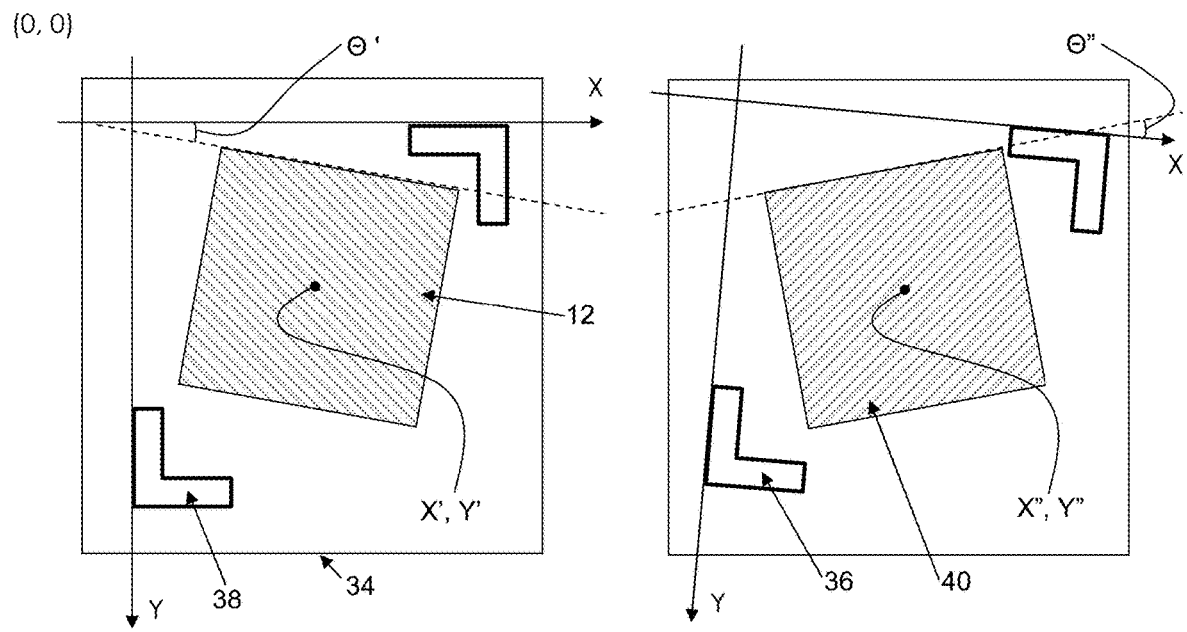
FIG. 3E  FIG. 3F

HIGH-PRECISION BOND HEAD POSITIONING METHOD AND APPARATUS

FIELD OF THE INVENTION

The invention relates to positioning a bond head for bonding electronic devices, such as semiconductor chips, in pick-and-place operations.

BACKGROUND AND PRIOR ART

Sizes and patterns of semiconductor devices and circuits are getting smaller, having a feature size that is as small as 3 nm to 7 nm. The sizes of input/output connections are also getting smaller, which requires very high mounting accuracy when performing pick-and-place operations. In order to achieve increases in bonding throughput, vision systems are used (1) to determine a position of a picked device whereat the bond head after the device is picked up, and (2) to determine a corresponding bonding position on a substrate prior to bonding the device.

The bond head may have to be adjusted in XY-theta directions according to computed offsets between the picked device and the bonding position. In this way, any relative positioning errors between the semiconductor devices held on the bond head and the substrate on a workholder can be avoided.

For instance, U.S. Pat. No. 7,597,234 entitled "Method for Mounting a Flip Chip on a Substrate" describes alignment of the bond head using two optical systems. Reference marks are attached to the sides of the bond head to enable measurement of the actual position of the semiconductor chip being held using an up-look optical system, and an actual position of a substrate's bonding position using a down-look optical system. The reference marks are visible to the respective optical systems during imaging.

However, the said optical systems have to inspect the semiconductor device on the bond head and the reference marks, and the substrate and the reference marks, when the reference marks are not at the same height or level as the semiconductor device or the substrate. The optical resolution of the optical system is limited by its depth of field, and therefore it is not possible to obtain high resolution images of objects that are at significantly different heights or levels.

It would be beneficial to increase optical alignment accuracy in a bonding machine without the aforesaid limitation concerning an optical system's depth of field as encountered in the approaches used in the prior art.

SUMMARY OF THE INVENTION

It is thus an object of the invention to seek to provide a method and apparatus for aligning an electronic device to a substrate in a bonding machine which takes into account changes in the mechanical structure of the bonding machine, as well as the limited depth of field in a high-resolution optical system.

According to a first aspect of the invention, there is provided a method for mounting a die at a bonding location, the method comprising the steps of: picking up a die with a bond head which incorporates a collet for holding the die and for bonding the die at the bonding location; with a first optical system, viewing and determining a position and orientation of the die relative to the bond head when the die is being held by the collet; with a second optical system, viewing and determining a position and orientation of the bonding location when the second optical system has its focal plane configured at a first distance from the second optical system; moving the bond head adjacent to the second optical system, and with the second optical system, viewing and determining a position and orientation of the bond head when the second optical system has its focal plane configured at a second distance from the second optical system which is different from the first distance; and thereafter adjusting the position and orientation of the die to correct a relative offset between the die and the bonding location prior to depositing the die onto the bonding location.

According to a second aspect of the invention, there is provided an apparatus for mounting a die at a bonding location, comprising: a bond head which incorporates a collet for holding the die and for bonding the die at the bonding location; a first optical system operatives to view and determine a position and orientation of the die relative to the bond head when the die is being held by the collet; a second optical system operative to view and determine a position and orientation of the bonding location when the second optical system has its focal plane configured at a first distance from the second optical system; wherein the second optical system is further operative to view and determine a position and orientation of the bond head when the second optical system has its focal plane configured at a second distance from the second optical system which is different from the first distance, when the bond head is moved adjacent to the second optical system; whereby the position and orientation of the die is adjustable for correcting a relative offset between the die and the bonding location prior to depositing the die onto the bonding location.

It would be convenient hereinafter to describe the invention in greater detail by reference to the accompanying drawings which illustrate specific preferred embodiments of the invention. The particularity of the drawings and the related description is not to be understood as superseding the generality of the broad identification of the invention as defined by the claims.

BRIEF DESCRIPTION OF THE DRAWINGS

An exemplary apparatus and method for aligning a semiconductor device in accordance with the invention will now be described with reference to the accompanying drawings, in which:

FIGS. 3A-3F illustrate an exemplary semiconductor device alignment process using the bonding system of FIG. 1;

DETAILED DESCRIPTION OF THE PREFERRED EMBODIMENT OF THE INVENTION

Figure 1:
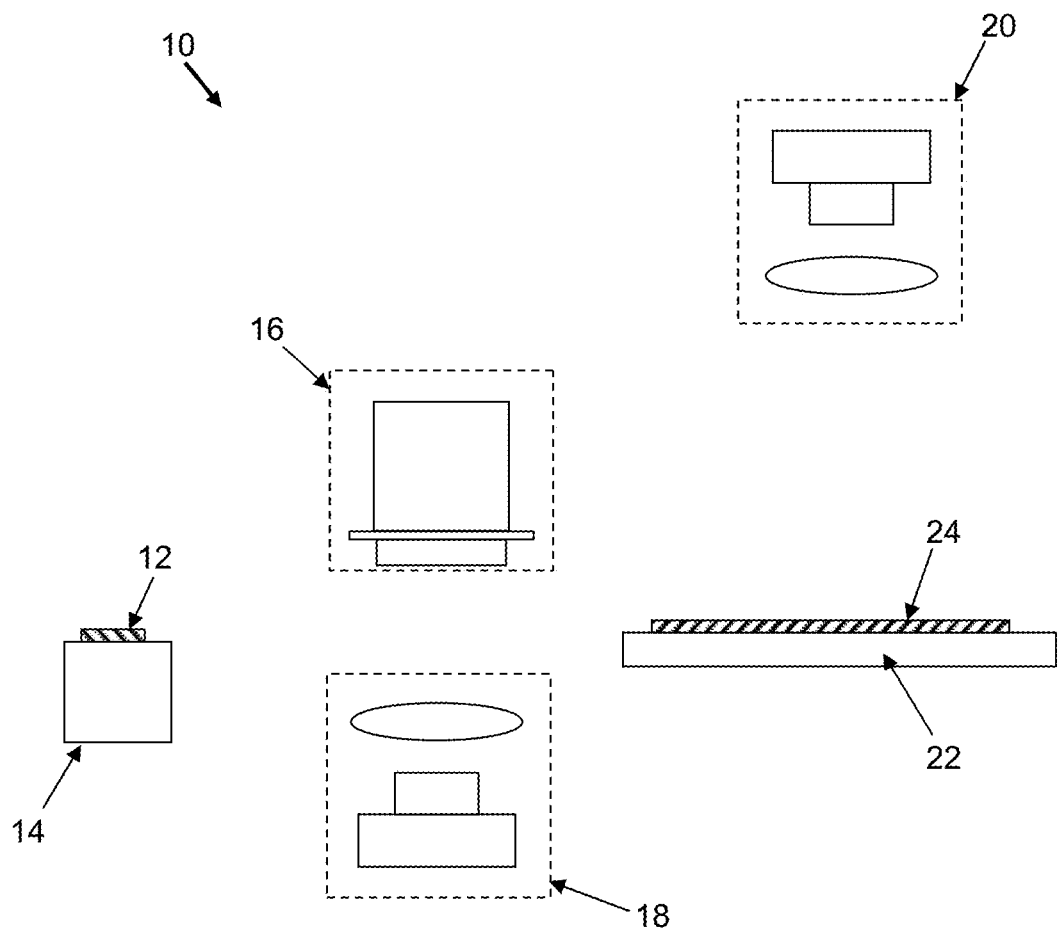
FIG. 1 is a schematic overview of a bonding system according to the preferred embodiment of the invention.

FIG. 1 is a schematic overview of a bonding system 10 according to the preferred embodiment of the invention for mounting a semiconductor chip or die at a bonding location. The bonding system 10 generally comprises a die holder 14 for holding an electronic device, such as a semiconductor die 12, a bond head 16 configured for picking up the die 12 from the die holder 14 and bonding the die 12 onto a substrate 24, a first optical system in the form of an up-look optical system 18 and a second optical system in the form of a down-look optical system 20. The substrate 24 is arranged on a bond stage 22.

In operation, the bond head 16, which incorporates a collet for holding a die, picks up a semiconductor die 12 from the die holder 14 and moves the die 12 to a position above the up-look optical system 18 for determining an orientation and position of the die 12 relative to the bond head 16 when it is being held by the collet of the bond head 16. At the same time, the down-look optical system 20 is stationary above the substrate 24 and inspects a bonding location on the substrate 24, typically comprising a bond pad on which the die 12 is adapted to be bonded for determining a position and orientation of the bonding location. The bond head 16 then conveys the die 12 above the substrate 24 and adjacent to the down-look optical system 20 for determining an orientation and position of the bond head 16. The position of the die 12 may have to be adjusted if necessary by re-orientating and translating the die 12 to correct a relative offset and to align it with the orientation and position of the bonding location. Once aligned, the die 12 is bonded by the collet onto the bonding location on the substrate 24.

Figure 2:
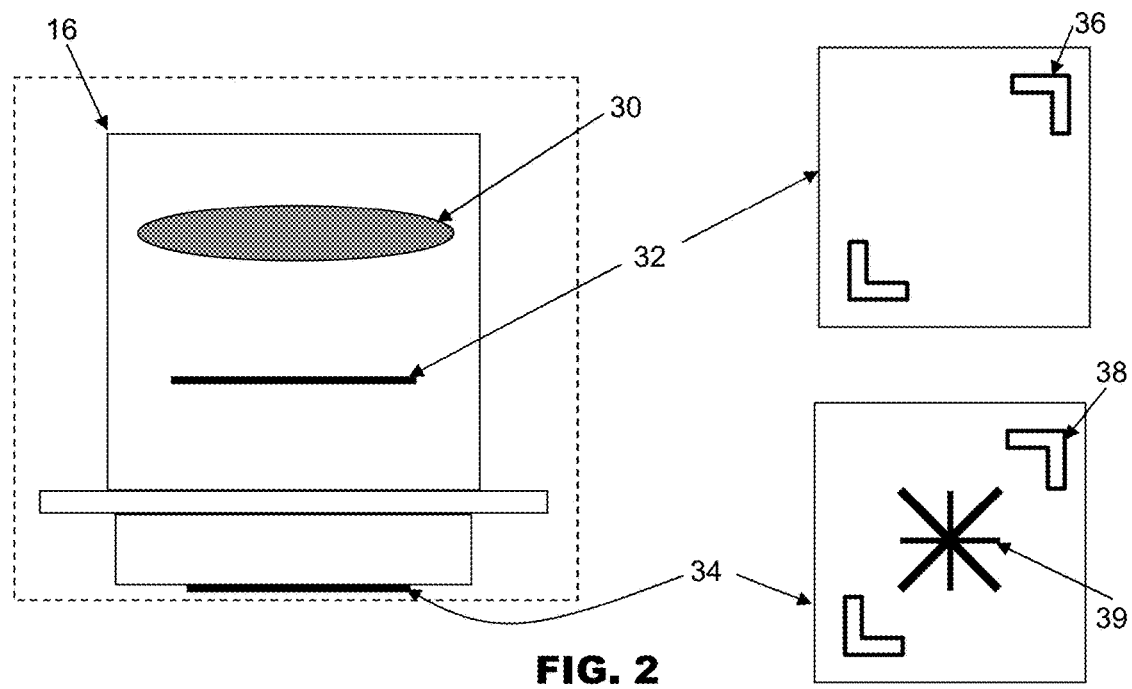
FIG. 2 is a cross-sectional view of a bond head of the bonding system illustrating reference marks situated on the bond head.

FIG. 2 is a cross-sectional view of the bond head 16 of the bonding system 10 illustrating separate fiducial marks such as reference marks 36, 38 situated on the bond head 16. The bond head 16 comprises a reference mark optical element such as an optical lens 30, as well as a mirror 32 and a collet 34. The collet 34 is operative to hold the die 12, usually by vacuum suction, during pick-and-place operations conducted by the bond head 16.

From a plan view of the mirror 32 as seen to the right of FIG. 2, a set of fiducial marks such as mirror reference marks 36 are centrally located on or within the bond head 16 at opposite corners of the mirror 32 for determining an orientation of the bond head 16. Locating the mirror reference marks 36 centrally on the bond head 16 enables greater precision when determining variations to the structure of the bond head 16 relative to the bonding location than by locating reference marks, for instance, at the sides of the bond head 16.

Further, from a bottom view of the collet 34 as seen to the right of FIG. 2, another set of fiducial marks such as collet reference marks 38 are located at opposite corners of the collet 34, and a vacuum suction port 39 is located at a center of the collet 34 whereat the die 12 is held by a vacuum suction force. However, it should be appreciated that any shapes which allow the orientation and position of the bond head 16 may be utilized instead. Moreover, that the collet reference marks 38 need not be located at corners of the collet 34 if a central position thereof is not blocked by a die 12, and they can be arranged to be visible to the up-look optical system 18 when the die 12 is held by the collet 34.

FIGS. 3A-3F illustrate an exemplary semiconductor device alignment process using the bonding system 10 of FIG. 1.

The following description explains the general principles of the process. A position and angular orientation of an object in an image may be denoted as (x, y, θ) where x and y are planar coordinates of an image plane of an imaging system along x- and y-axes respectively, while θ is an angular offset of the object from the x-axis. In turn, physical coordinates of a bond head 16 (measured with respect to reference marks such as the collet reference marks 38) may be denoted as (X, Y, Θ). When the image plane or focal plane of an optical system is aligned to be parallel to a plane of the object, then (x, y, θ) and (X, Y, Θ) are related by an affine transformation with scale, rotation and translation that may be expressed as:

$$X = s \cdot \cos(\varphi) \cdot x - s \cdot \sin(\varphi) \cdot y;$$

$$Y = s \cdot \sin(\varphi) \cdot x + s \cdot \cos(\varphi) \cdot y; \text{ and}$$

$$\Theta = \theta + \varphi$$

where s is a resolution of the imaging system in pixels, and φ is an angular difference between an image coordinate and a bond head coordinate, which is determinable from calibration prior to actual bonding.

Figure 3A:
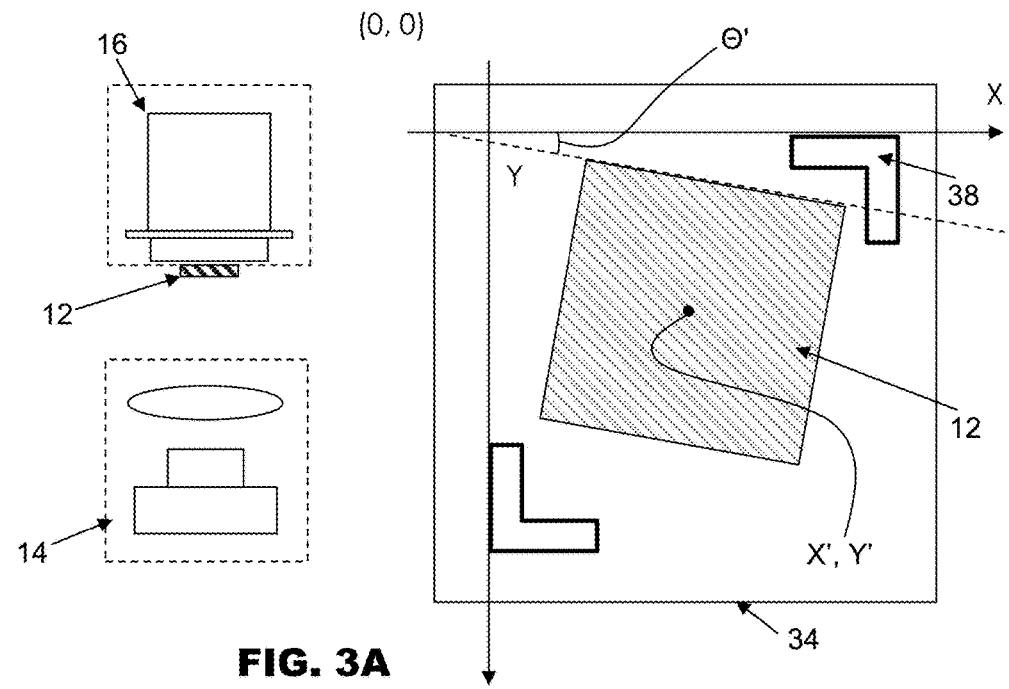

In FIG. 3A, the bond head 16 is carrying a die 12 and is holding it above the up-look optical system 14. The image as observed by the up-look optical system 14 is illustrated to the right of FIG. 3A. The die 12 is oriented at an angle Θ' with respect to first fiducial marks in the form of the collet reference marks 38 located on the collet 34.

The image coordinates of the die 12 with respect to the collet reference marks 38, and hence its physical coordinates with respect to the bond head 16, can be determined using the following formulas:

$$X' = s' \cdot \cos(\varphi') \cdot x' - s' \cdot \sin(\varphi') \cdot y';$$

$$Y' = s' \cdot \sin(\varphi') \cdot x' + s' \cdot \cos(\varphi') \cdot y'; \text{ and}$$

$$\Theta' = \theta' + \varphi'$$

where s' is a resolution of the up-look optical system 14 in pixels, and φ' is an angular difference of the up-look optical system 14 and the bond head coordinates. x' and y' are planar coordinates of an image plane of the imaging system along x- and y-axes respectively.

Hence, from the said image, coordinates of a center X', Y' of the die 12 which is held on the collet 34, and an angular orientation thereof, can be calculated.

Figure 3B:
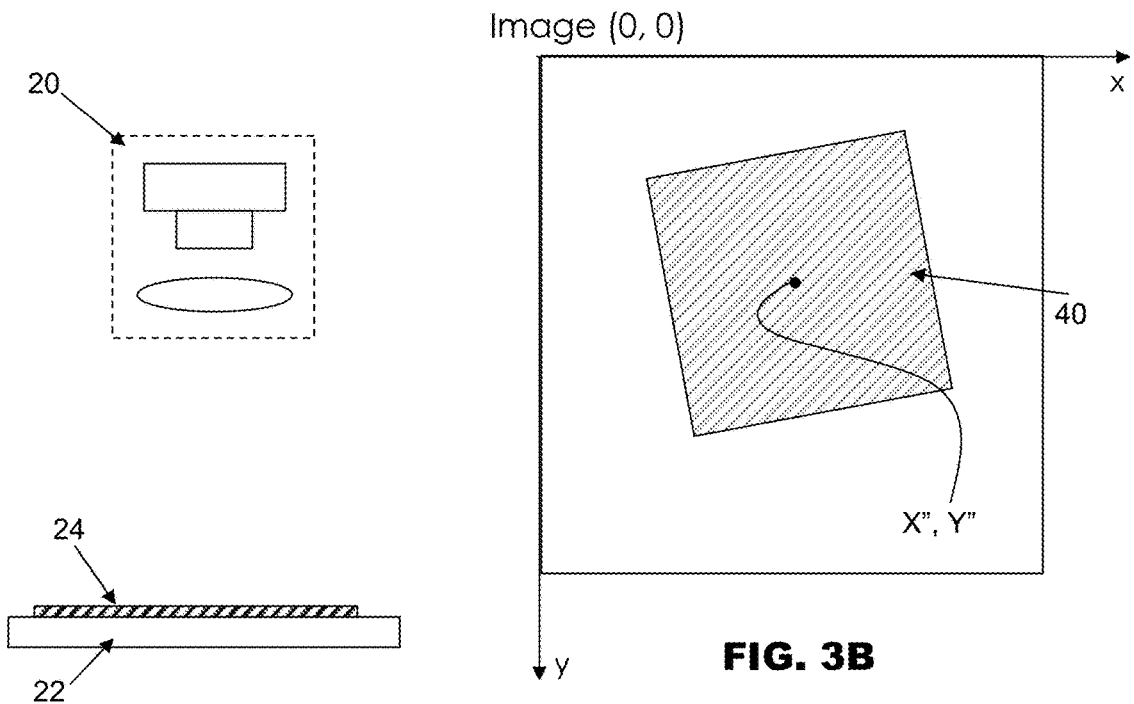

In FIG. 3B, the down-look optical system 20 is viewing a bonding location in the form of a die pad 40 on the substrate 24. The die 12 illustrated in FIG. 3A is to be bonded onto this die pad 40. The image of the die pad 40 which lies on a focal plane of the down-look optical system 20 configured at a first distance therefrom, as seen by the down-look optical system 20, is illustrated to the right of FIG. 3B. The die pad 40 is oriented at an angle Θ" with respect to the down-look optical system 20 (see FIG. 3F), and the coordinates of a center X", Y" of the die pad 40 are also calculated. The coordinates and orientation of the die pad 40 with respect to the coordinates of the down-look optical system 20 are recorded.

Figure 3C:
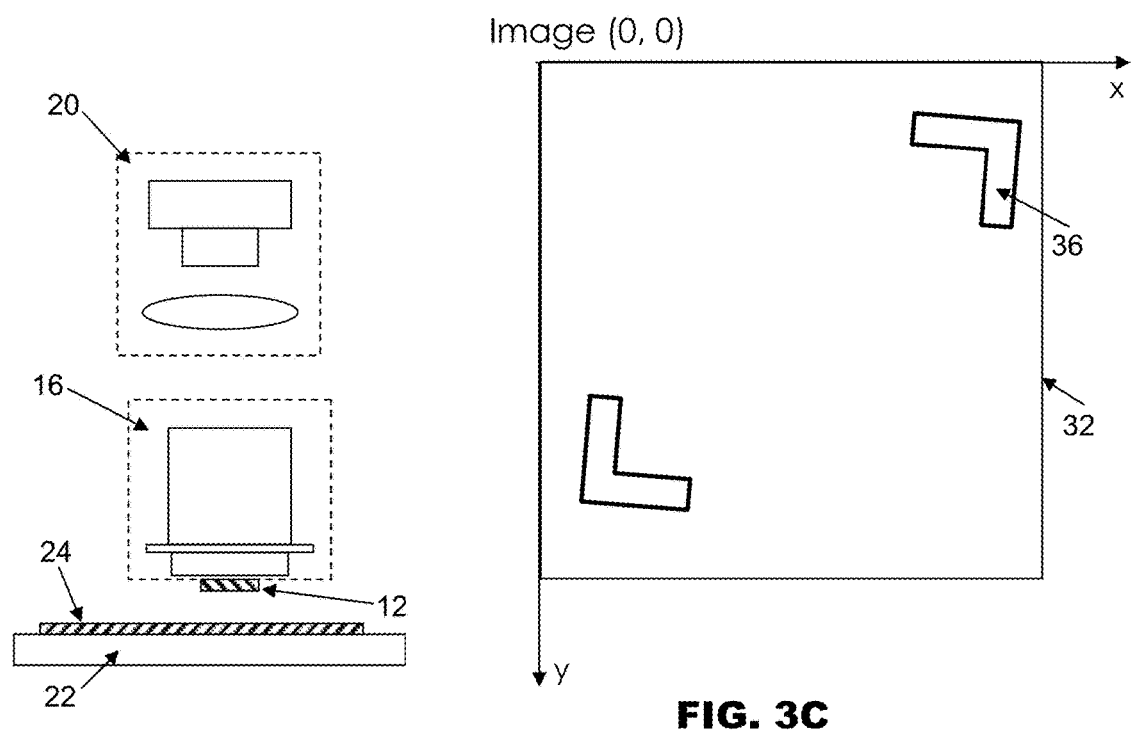

In FIG. 3C, the bond head 16 has moved the die 12 to a position over the bond pad 40 to which the die 12 is to be bonded, as well as adjacent to and below the down-look optical system 20. In this position of the bond head 16, an image of the mirror reference marks 36 that are located at opposite corners of the mirror 32, which lies on a focal plane of the down-look optical system 20 at a second distance therefrom, is captured by the down-look optical system 20, as can be seen in the image to the right of FIG. 3C. Accordingly, the focal plane of the down-look optical system 20 at the second distance is located at a same height as that of the mirror reference marks 36. The coordinates and orientation of the mirror reference marks 36 (which are virtually generated) with respect to the coordinates of the down-look optical system 20 are recorded.

The reference to virtual generation of the mirror reference marks 36 arises from the fact that the bond head 16 has a set of collet reference marks 38 at a tip of the bond head 16, and a set of mirror reference marks 36 (Rv, see FIG. 5) within a body of the bond head 16. An optical assembly is suitably constructed within the bond head 16 such that the image of the mirror reference marks 36 (Rv, which further generate virtual reference marks at Rv_i) when viewed by the down-look optical system 20) would align to a virtual focal plane of the down-look optical system 20 at a level of the substrate 24 via the said optical system. As the mirror reference marks 36 are vertically related by an affine transformation to the collet reference marks 38, in this way, an alignment of the bond head 16 may be inspected at the position of the down-look optical system 20 even though the collet reference marks 38 are hidden and cannot be observed by the down-look optical system 20.

Based on the image coordinates of the die pad 40 with respect to the mirror reference marks 36 (denoted as (X″, Y″, Θ″)), the physical coordinates of the bond head 16 can be calculated as:

$$X''=s''\cdot\cos(\varphi'')\cdot x''-s''\cdot\sin(\varphi'')\cdot y'';$$

$$Y''=s''\cdot\sin(\varphi'')\cdot x''+s''\cdot\cos(\varphi'')\cdot y''; \text{ and}$$

$$\Theta''=\theta''+\varphi''$$

Therefore, when the bond head 16 is stationary in the position between the down-look optical system 20 and the bond pad 40, a processor (not shown) of the bonding system 10 may superimpose an image of the bond pad 40 against the mirror reference marks 36, which represent the actual position of the bond head 16. Such imposition as seen in the image to the right of FIG. 3D illustrates a relative offset between the bond head 16 and the bond pad 40 and can be used to align the die 12 being held on the bond head 16 relative to the bond pad 40.

Thereafter, the processor compares the image of the die 12 and the collet reference marks 38 (illustrated in FIG. 3E) with the image of the bond pad 40 superimposed on the mirror reference marks (illustrated in FIG. 3F). Since locations of the mirror reference marks 36 are manufactured such that they correspond vertically to locations of the collet reference marks 38, an offset between the die 12 and the bond pad in the X, Y and angular directions may be accurately determined. Based on the offset that is determined, the center X′, Y′ of the die 12 may be adjusted to a position above the center X″, Y″ of the bond pad 40, and the angular orientation Θ′ of the die 12 may be rotated by the bond head 16 to align it with that of the bond pad 40. In this way, the aligned die 12 may be accurately placed and bonded onto the bond pad 40.

More specifically, prior to bonding, a position and angle of the bond head 16 may be adjusted accordingly as noted below:

$$\Delta X=X''-X'$$

$$\Delta Y=Y''-Y'$$

$$\Delta\Theta=\Theta''-\Theta'$$

Figure 4:
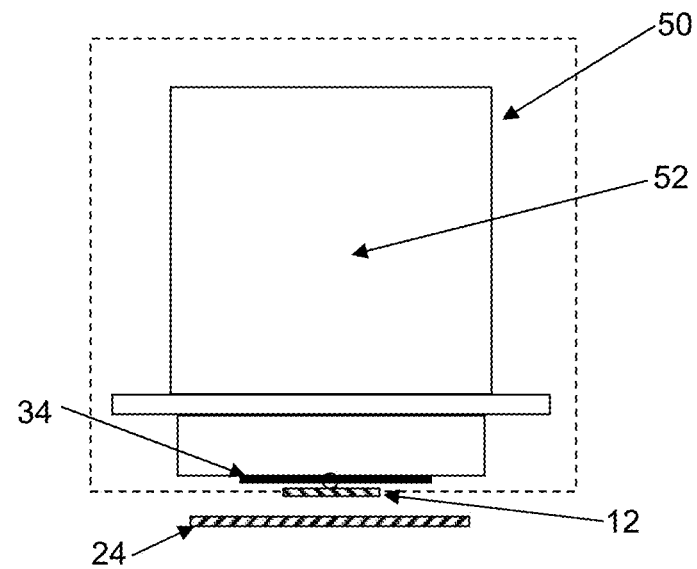
FIG. 4 is a cross-sectional view of an embodiment of a bond head incorporating a hollow space inside the bond head.

FIG. 4 is a cross-sectional view of an embodiment of a bond head 50 incorporating a hollow space 52 inside the bond head 50. Creating a hollow space 52 in the bond head 16 allows the down-look optical system 20 to see through the bond head 16 all the way to the collet 34 in order to view the collet reference marks 38 directly, without the need to create virtual marks as described above. Nevertheless, this approach is not possible if some other component such as a heater is present within the hollow space 52 of the bond head 16, which blocks the view of the down-look optical system 20. In this case, an optical assembly should instead be constructed inside the bond head 50 such that the hollow space 52 creates a light path from the down-look optical system 20 to the optical assembly.

Figure 5:
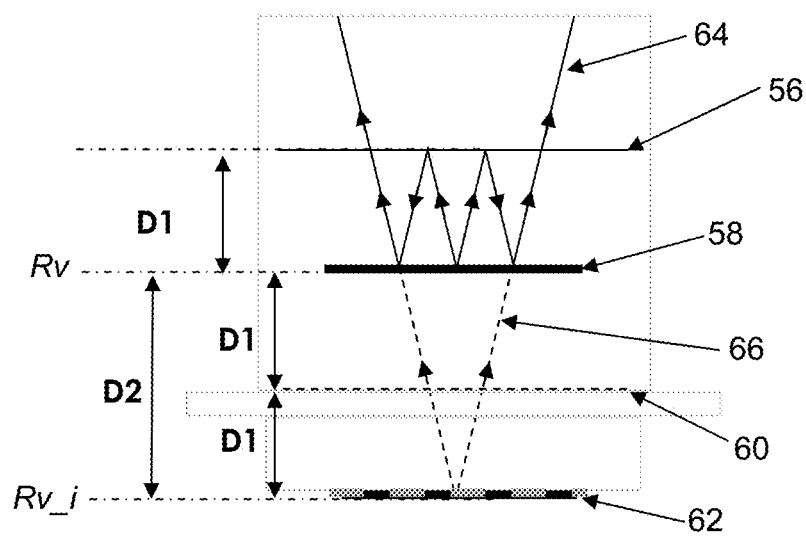
FIG. 5 is a cross-sectional view of the embodiment of a bond head incorporating a beam splitter and a mirror inside the bond head.

For instance, FIG. 5 is a cross-sectional view of the embodiment of the bond head 50 incorporating an optical assembly constructed on the bond head 16 comprising a beam splitter 56 and a mirror 58 inside the bond head 50, and which demonstrates the principles of the beam splitter 56 and mirror 58. The mirror 58 is preferably coated with mirror reference marks (not shown) for indicating a position and orientation of the bond head 50, and a focal plane of the down-look optical system 20 is configured by the optical assembly to be at the second distance, where the mirror reference marks at located.

Light rays 64 are introduced into the bond head 50 from a top of the bond head 50 through the hollow space 52 onto a beam splitter 56 incorporated in the bond head 50. Some of the light rays 64 are transmitted through the beam splitter 56 onto the mirror 58 at a reference height Rv, which is at a distance D1 from the first beam splitter 56. The mirror 56 has mirror reference marks for determining a position of the bond head 50.

Although the incident light rays 64 do not actually pass through the mirror 58, virtual light rays 66 are created beyond the mirror 58, which virtual light rays 66 converge towards a position of the substrate 24 at a virtual focal plane 62 (at height Rv_i), which is at a distance D2 from the mirror 58. It should be appreciated that the distance D2 is twice the distance D1. In this arrangement, whilst a depth of field of the down-look optical system 20 allows it to inspect an orientation of a bond pad on a substrate, the down-look optical system 20 will also be able to view the mirror reference marks on the mirror 58 when the bond head 50 is located between the down-look optical system 20 and the substrate 24. Accordingly, the position of the bond head 50 is observable by the down-look optical system 20 during alignment when the bond head 50 is above the position of the substrate.

Figure 6:
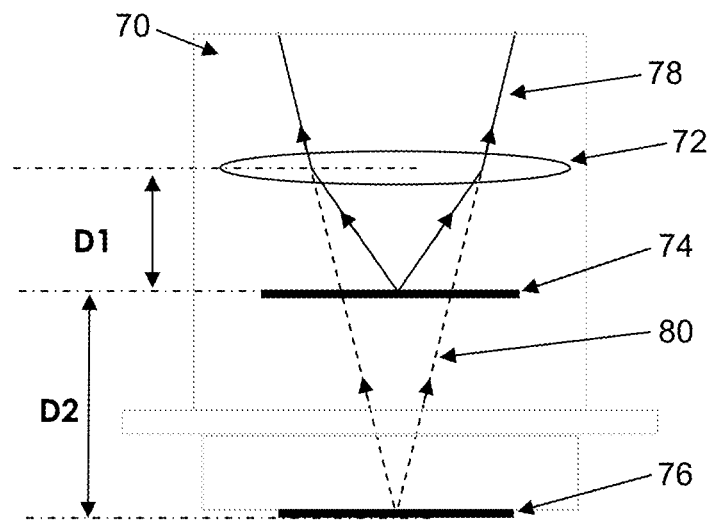
FIG. 6 is a cross-sectional view of an embodiment of a bond head incorporating a lens for changing a focal length of an image viewed by a down-look optical system.

FIG. 6 is a cross-sectional view of an embodiment of a bond head 70 incorporating an optical assembly comprising a lens 72 for changing a focal length of an image viewed by a down-look optical system 20. The lens 72 is a converging lens, and may be mounted inside a hollow space 52 (see FIG. 5) in the bond head 70. Light rays 78 from a top of the bond head 70 pass through the lens 72 onto a mirror 74, on which there are second fiducial marks in the form of mirror reference marks (not shown) for determining a position and orientation of the bond head 70. The mirror 74 is arranged at a reference position Rv.

Figure 7:
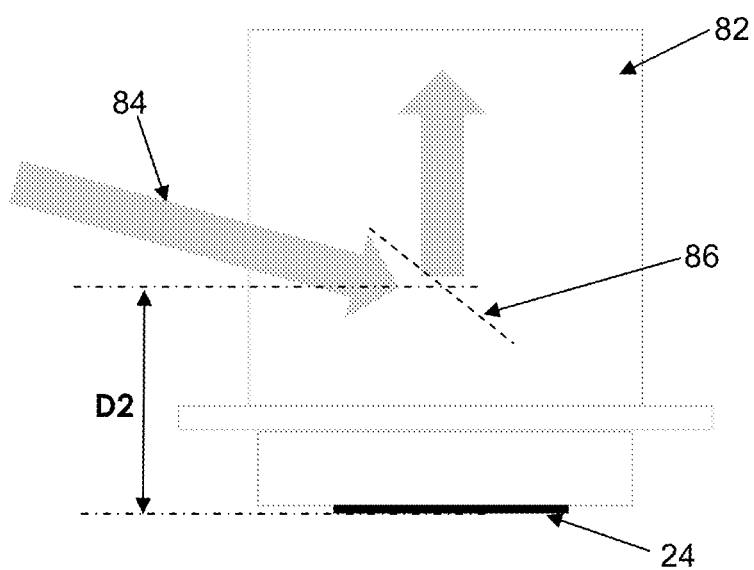
FIG. 7 is a cross-sectional view of an embodiment of a bond head that incorporates a photographic plate.

Although the light rays 78 do not actually pass through the mirror 74, virtual light rays 80 are created which tend to converge at a position of the substrate 24 at a virtual focal plane 76. A distance D2 separating the mirror 74 and the virtual focal plane 76 should be twice the distance D1 separating the lens 72 and the mirror 74, as illustrated in FIG. 7. In this arrangement, whilst a down-look optical system 20 is able to inspect an orientation of a bond pad on the substrate, the down-look optical system 20 will also be able to view reference marks on the mirror 74 when the bond head 70 is located between the down-look optical system 20 and the substrate 24, so that the position of the bond head 70 is observable by the down-look optical system 20 during alignment.

FIG. 7 is a cross-sectional view of an embodiment of a bond head 82 that incorporates an optical assembly comprising a photographic plate 86 in the bond head 82. The photographic plate 86 has reference marks (not shown) indicating a position of the bond head 82. When the bond head 82 is moved to a position between the down-look optical system 20 and a substrate, the down-look optical system 20 will be able to view the photographic plate 86. The photographic plate 86 may be separated from a substrate 24 by a distance D2. When an incident laser beam 84 is directed at the photographic plate 86, a holographic image of the reference marks on the photographic plate 86 is reconstructed and its image is virtually detected by the down-look optical system 20 at the reference height Rr. An alignment of the bond head 84 may thus be aligned by the reference marks appearing on the photographic plate 86.

Figure 8A:
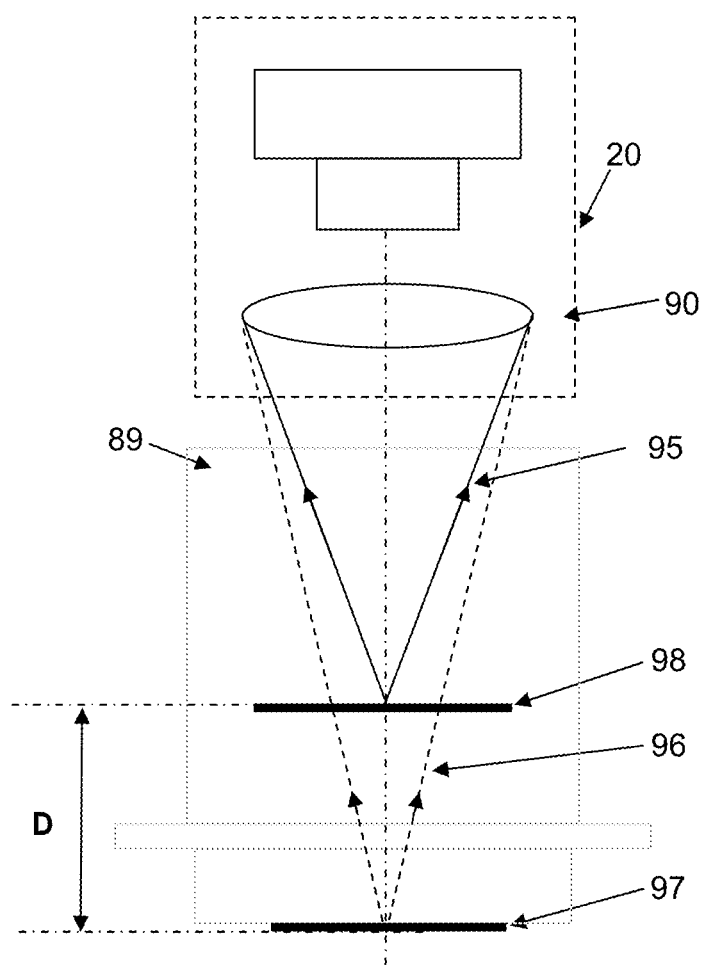
FIGS. 8A-8C are cross-sectional views of an embodiment of a bond head which uses two different wavelengths or colors of light to establish two separate focusing distances for the down-look optical system.
Figure 8B:
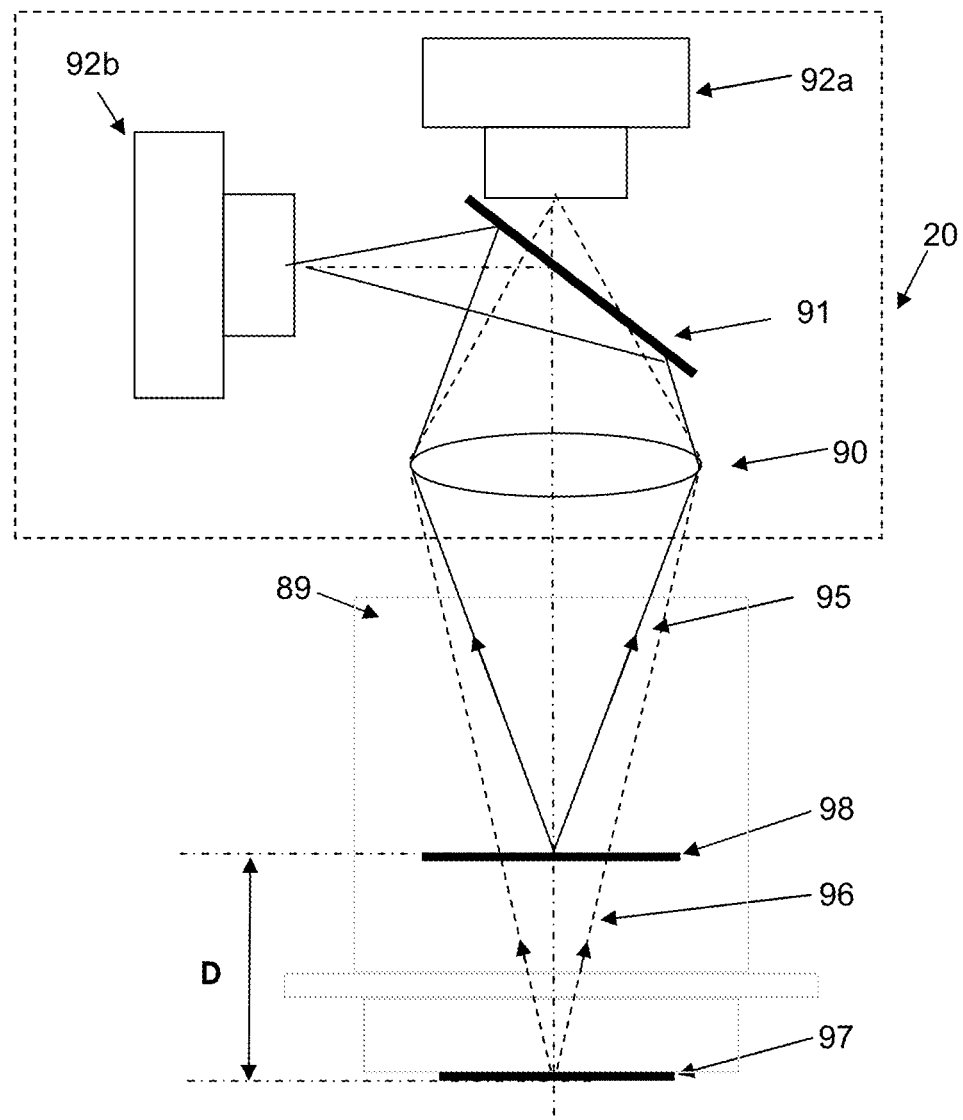
Figure 8C:
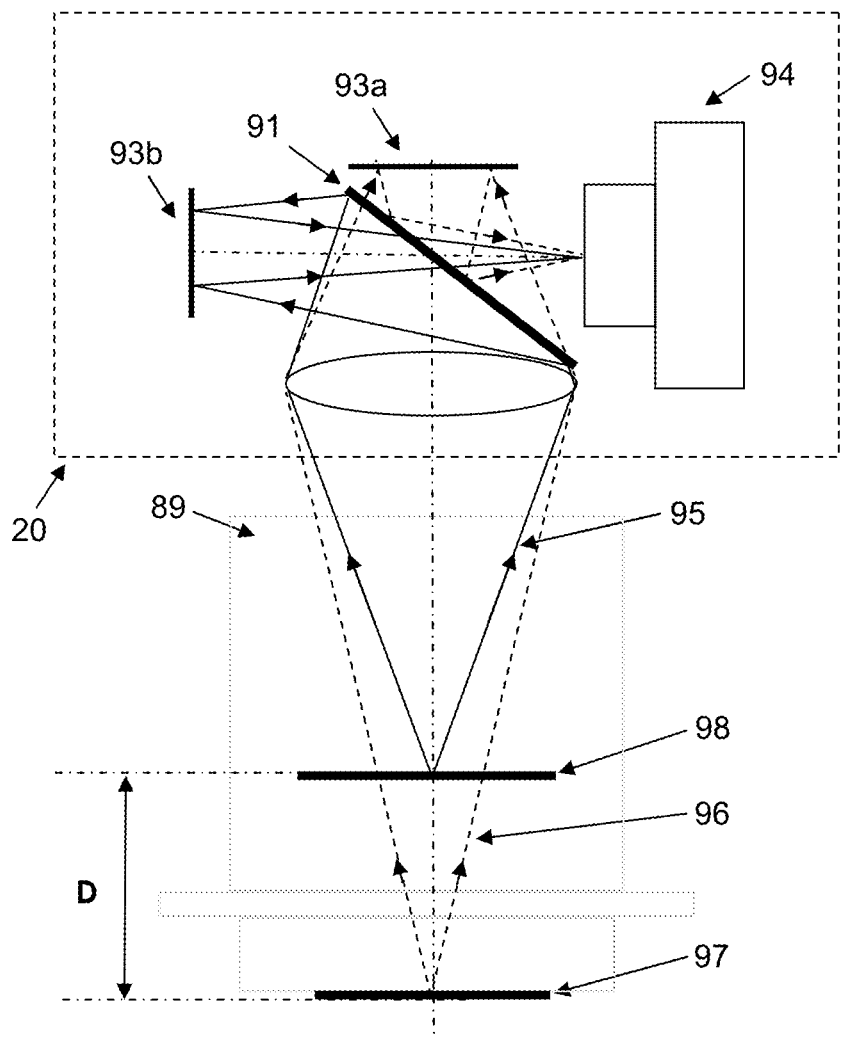

FIGS. 8A to 8C are cross-sectional views of an embodiment of a bond head 89 that is positioned below the down-look optical system 20, such that two different wavelengths or two different colors of light are focused at different distances from a converging lens 90 that is incorporated in the down-look optical system 20. For example, red light 96 may be focused onto a focal plane 97 located at a first distance from the down-look optical system 20 where the substrate is situated, while blue light 95 may be focused at a reference mark located on a focal plane 98 located at a second distance from the down-look optical system 20. Accordingly, different wavelengths or colors of light are used to attain the respective focal planes 97, 98 for inspection.

There are several methods to achieve the aforesaid objective. In FIG. 8A, a converging lens 90 is designed with axial chromatic aberration characteristics so that different wavelengths or colors of light are focused onto focal planes 97, 98 that are at different distances along an optical axis of the converging lens 90. In this setup, the alignment of the images obtained from the blue and red lights 95, 96 may be ensured by optical design, and so no further mechanical adjustment is needed.

In FIG. 8B, a dichroic beam splitter 91 is used to direct the two wavelengths or colors of light along two different light paths, which are subject to different optical lengths. The images obtained from the two different colors are then captured by two separate imaging sensors 92a, 92b. In the illustration, an image along a first focal plane 97 is captured by a first imaging sensor 92a, while an image along a second focal plane 98 is captured by a second imaging sensor 92b. In this system, the coordinates (offset and orientation) of the imaging sensors 92a, 92b may be calibrated in advance.

In FIG. 8C, a beam splitter 91 incorporated in the down-look optical system 20 splits the two wavelengths or colors of light to two separate dichroic mirrors 93a, 93b. The dichroic mirrors 93a, 93b are arranged to reflect the two different wavelengths or colors of light 95, 96 back to the same camera 94. The dichroic mirrors 93a, 93b are located at different distances from the beam splitter 91, such that the different wavelengths or colors of light can be focused at the two focal planes 97, 98 at the first and second distances from the down-look optical system 20 respectively.

It should be appreciated that positioning errors of a bond head 16 with respect to a substrate 24 can be measured and eliminated by the bonding system 10 according to the preferred embodiments of the invention, so that bonding accuracy is further improved.

Although the design of the bond head 50 may include a hollow space 52, and the hollow space 52 may further include a transparent or L-shaped intermediary layer, it is not strictly necessary for a line of sight to be available from the down-look optical system 20 to the collet 34, since virtual reference marks may be created at the level of the substrate 24 locating a position of the bond head 16. In particular, the approach may address situations where a hollow space 52 is not possible when mounting large semiconductor chips that have heat and force requirements.

Since the various images captured of the reference marks 36, 38 require only short-time and short-range relative measurements, adjustments of the bond head 16 may be performed without the measurements being unduly affected by thermal and other systematic errors during alignment. Furthermore, the bonding system 10 avoids the need for expensive materials for constructing the machine structure, as well as the need for very strict temperature controls for the whole machine.

The invention described herein is susceptible to variations, modifications and/or additions other than those specifically described and it is to be understood that the invention includes all such variations, modifications and/or additions which fall within the spirit and scope of the above description.

The invention claimed is:

1. A method for mounting a die at a bonding location, the method comprising the steps of:
   picking up a die with a bond head which incorporates a collet for holding the die and for bonding the die at the bonding location;
   with a first optical system, viewing and determining a position and orientation of the die relative to the bond head when the die is being held by the collet;
   with a second optical system, viewing and determining a position and orientation of the bonding location when the second optical system has its focal plane configured at a first distance from the second optical system;
   moving the bond head adjacent to the second optical system, and with the second optical system, viewing and determining a position and orientation of the bond head when the second optical system has its focal plane configured at a second distance from the second optical system which is different from the first distance; and thereafter
   adjusting the position and orientation of the die to correct a relative offset between the die and the bonding location prior to depositing the die onto the bonding location.

2. The method as claimed in claim 1, wherein the bond head comprises a first fiducial mark indicating the position and orientation of the die that is viewable by the first optical system, and a second fiducial mark separate from the first fiducial mark indicating a position and orientation of the bond head that is viewable by the second optical system.

3. The method as claimed in claim 2, wherein an image captured by the first optical system comprises the die and the first fiducial mark, and images captured by the second optical system comprise the second fiducial mark and the bonding location respectively.

4. The method as claimed in claim 2, wherein the second fiducial mark is centrally located within the bond head.

5. The method as claimed in claim 4, wherein the first fiducial mark is located on the collet, and is arranged to be visible to the first optical system when the die is held by the collet.

6. The method as claimed in claim 5, wherein the second fiducial mark on the bond head is vertically related by an affine transformation to the first fiducial mark on the collet.

7. The method as claimed in claim 2, wherein the focal plane of the second optical system at the second distance is located substantially at a same height as that of the second fiducial mark.

8. The method as claimed in claim 1, wherein the bond head further comprises an optical assembly constructed in the bond head for configuring the focal plane of the second optical system at the second distance.

9. The method as claimed in claim 8, wherein the bond head comprises a hollow space for creating a light path from the second optical system to the optical assembly constructed inside the bond head.

10. The method as claimed in claim 8, wherein the optical assembly includes a beam splitter and a mirror.

11. The method as claimed in claim 10, wherein the mirror is further coated with a fiducial mark for indicating a position and orientation of the bond head.

12. The method as claimed in claim 8, wherein the optical assembly includes a converging lens which converges light rays onto a fiducial mark located on the bond head for indicating a position and orientation of the bond head.

13. The method as claimed in claim 1, wherein the second optical system further comprises an optical assembly constructed for configuring the focal plane of the second optical system at the second distance.

14. The method as claimed in claim 13, wherein the optical assembly focuses at least two different wavelengths of light onto the two focal planes at the first and second distances from the second optical system.

15. The method as claimed in claim 14, wherein the first distance is at a height of a fiducial mark for indicating a position and orientation of the bond head and the second distance is at a height of the bonding location.

16. The method as claimed in claim 14, wherein the optical assembly includes a converging lens having axial chromatic aberration.

17. The method as claimed in claim 14, wherein the optical assembly includes a dichroic beam splitter to direct the two different wavelengths of light onto two different light paths, each light path forming an image that is captured by a different imaging sensor.

18. The method as claimed in claim 14, wherein the optical assembly includes a beam splitter that directs the different wavelengths of light to different dichroic mirrors located at different distances from the beam splitter which respective dichroic mirrors reflect the two different wavelengths of light onto a same imaging sensor.

19. An apparatus for mounting a die at a bonding location, comprising:
a bond head which incorporates a collet for holding the die and for bonding the die at the bonding location;
a first optical system operatives to view and determine a position and orientation of the die relative to the bond head when the die is being held by the collet;
a second optical system operative to view and determine a position and orientation of the bonding location when the second optical system has its focal plane configured at a first distance from the second optical system;
wherein the second optical system is further operative to view and determine a position and orientation of the bond head when the second optical system has its focal plane configured at a second distance from the second optical system which is different from the first distance, when the bond head is moved adjacent to the second optical system;
whereby the position and orientation of the die is adjustable for correcting a relative offset between the die and the bonding location prior to depositing the die onto the bonding location.

* * * * *